Nov. 27, 1962 G. V. LENNON III 3,066,259

SUPPRESSED CARRIER TRANSMITTER

Filed Jan. 3, 1961

INVENTOR.
GEORGE V. LENNON III
BY
T. L. Styner
ATTORNEY

United States Patent Office 3,066,259
Patented Nov. 27, 1962

3,066,259

SUPPRESSED CARRIER TRANSMITTER

George V. Lennon III, Rochester, N.Y., assignor to General Dynamics Corporation, Rochester, N.Y., a corporation of Delaware Filed Jan. 3, 1961, Ser. No. 80,285
4 Claims. (Cl. 325—105)

This invention relates to communication systems and is particularly directed to single or double sideband transmitters with means for modulating a carrier with voltages of audio or other intelligence-bearing frequencies to produce modulation products containing the upper and/or lower sideband, the modulation products being characterized by the total absence of carrier components.

The several conventional methods of single or double sideband modulation leaves much to be desired in the matter of carrier suppression. That is, a high ratio of sideband-to-carrier voltages at the transmitter output is difficult to obtain. In theory, the carrier components can be canceled by balancing techniques, but, in practice, the carrier is present in considerable proportions and expensive filtering is required to eliminate those components. In addition, power is wasted.

An object of this invention is to provide an improved sideband transmitter.

A more specific object of this invention is to provide an improved modulator for sideband transmitters.

A still more specific object of this invention is an improved modulator in which a carrier is modulated with a signal voltage and in which the carrier is completely suppressed at the output terminals of the modulator stage.

The objects of this invention are attained by a Hall-effect generator where a wafer of semiconducting material is placed in a magnetic field, which field is modulated by the audio or other signal to be transmitted. Terminals are attached to one pair of opposite edges of the wafer and are connected to a source of the high frequency carrier to be modulated. The wafer is so oriented in the magnetic field that the carrier current flowing between the two terminals is at right angles to the magneic field. Hall-effect voltages are derived at the remaining two edges of the wafer and are connected across a balanced load network from which the useful modulation products are conducted to a band-pass filter to select either or both of the two sidebands. The carrier voltages, it has been found, are completely suppressed in the Hall wafer, and the effects of stray carrier voltages between input and output leads and stray carrier currents along leakage paths of the wafer are effectively eliminated in the balanced load network.

Figure 1:
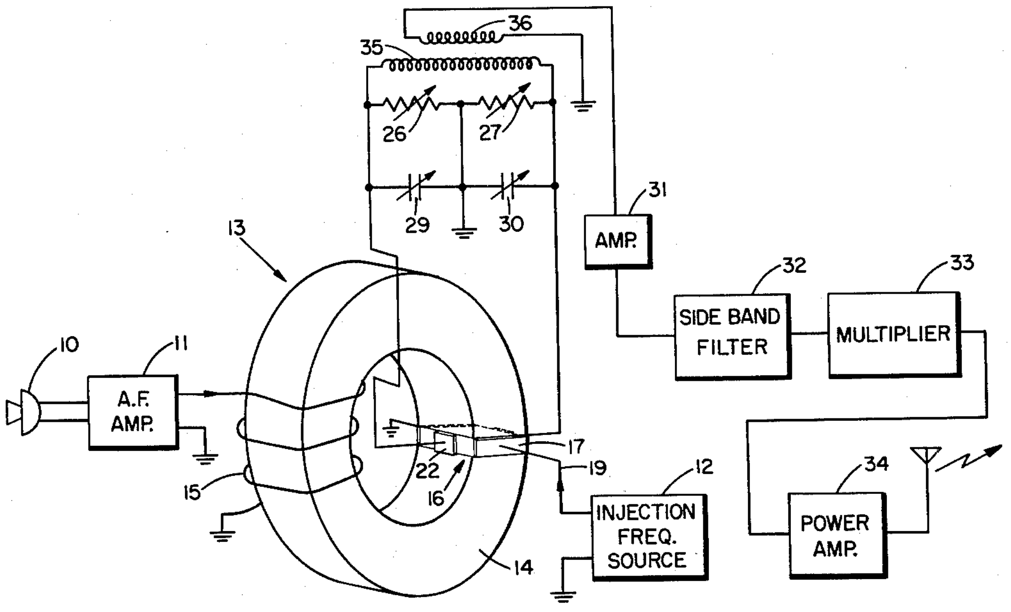
Figure 2:
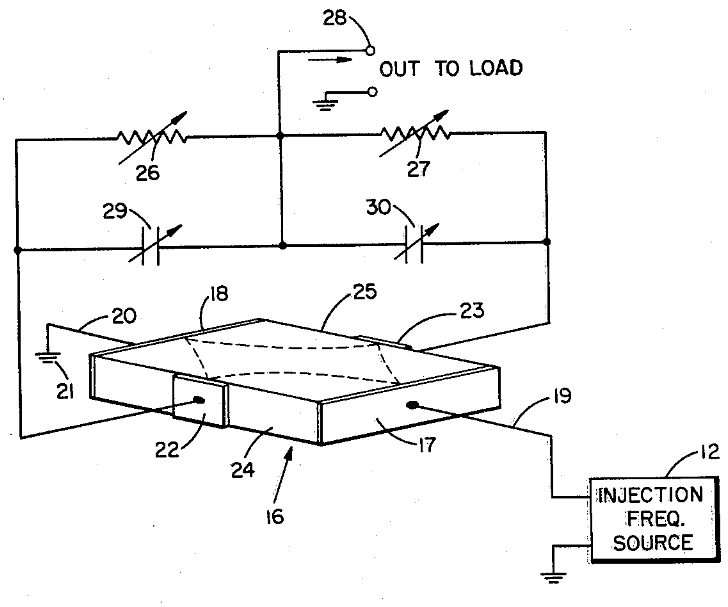

Other objects and features of this invention will become apparent to those skilled in the art by referring to the specific embodiment described in the following specification and shown in the accompanying drawing in which:

FIG. 1 is a block diagram of the transmitter of this invention with enlarged details of the modulator portion of the transmitter; and FIG. 2 shows in perspective the mechanical details of the Hall modulator element of this invention.

The signal circuit shown comprises the microphone 10, although the signal voltage may be derived from any of the many well known signal generators. The audio frequencies of the microphone are amplified at 11, as usual. The carrier on to which the signal is to be impressed is derived from the injection frequency source 12. The injection frequency may be equal to the carrier frequency to be transmitted, or, if desired, may be of a lower frequency which can later be multiplied to the desired transmitting frequency.

According to an important and characteristic feature of this invention, the injection frequency is modulated by the signal frequency in the modulator structure 13. The structure 13 comprises a magnetic core 14 on which is wound the turns 15 of a coil connected to the output of the signal amplifier 11. The wafer 16 of semiconducting material which will produce a substantial Hall-effect voltage is placed in the air gap of the core 14 and is so oriented that the magnetic lines of force between the faces of the core are perpendicular to the face of the wafer. As better shown in FIG. 2, the end edges 17 and 18 of the wafer are electrically connected as by solder to input terminals 19 and 20. Terminals 19 and 20 are connected, respectively, to the injection frequency source 12 and to the ground 21.

The material of the wafer 16 is of a hard coherent semiconductor compound which has a high charge carrier mobility and therefore produces a substantial Hall-effect voltage at the output terminals connected to the remaining two edges of the wafer. Indium antimonide or indium arsenide are two compounds of many which are suitable for this purpose. In FIG. 2, the output terminals 22 and 23 for the Hall voltage are connected, as by soldering, to the side edges 24 and 25 of the wafer. The terminals 22 and 23 define a current path through the wafer which is orthogonal both to the current path between the input terminals 19 and 20 and to the magnetic lines of force.

According to the next important feature of this invention, the output terminals 22 and 23 are connected to the ends of he balancing potentiometer comprising resistors 26 and 27, the midpoint or junction of the potentiometer being connected directly to ground as in FIG. 1, or indirectly to ground through a load circuit as in FIG. 2. One or both resistors are preferably adjustable. Shunted across the resistors 26 and 27 are connected condensers 29 and 30, one or both of which are adjustable. The useful output of the modulator, including the two sidebands, may be derived in several ways. In FIG. 1, the transformer winding 35 is connected across the potentiometer and is inductively coupled to the winding 36, which in turn is connected to the useful load. Alternatively, the junction of the resistor may be connected, as shown in FIG. 2, directly to the useful load in which the reference ground is established.

The useful load comprises, typically, a sideband transmitter including the amplifier 31 to amplify the modulator voltage output. Incorporated in the amplifier stages or following the amplifier stages is the sideband filter 32 which is constructed to pass either the upper sideband or the lower sideband or both. If the frequency of the injection frequency source is not high enough for transmission, the desired frequency may be obtained in multiplier 33, the output being finally amplified to transmission levels by the power amplifier 34. The output of the power amplifier 34 may be radiated from an antenna or transmitted over suitable transmission lines.

It has been proven that the instantaneous Hall voltage, $V_h$, at the output terminals (22 and 23) of the wafer is proportional to $$\frac{R \cdot I_c \cdot b \cdot 10^{-8}}{d}$$

where $I_c$ is the instantaneous control current in amperes, where $b$ is the instantaneous flux density in gauss, where $d$ is the thickness of the wafer, and where R is the Hall constant expressed in ohm-cubic centimeters per coulomb. It will be noted that the Hall voltage $V_h$ is equal to the product of the control current $I_c$ and the instantaneous flux density, $b$. Accordingly, if $b$ varies at signal frequency and $I_c$ varies at injection frequency, the output Hall voltage will contain the product of these two quantities which contains the sidebands of these two quantities. It is significant, further, that the injection frequency, $I_c$, does not occur at the output terminals uncombined with the signal term, *b*. Importantly, the output Hall voltage varies substantially linearly with both control current, $I_c$, and field strength, *b*, and hence the product of the two varies linearly. Herein lies the explanation of the freedom of the output voltage $V_h$ from harmonic distortions.

Although the impedances between the input and output terminals of the Hall wafer are very high and the currents are very low, small uncontrolled leakage paths occur between the terminals and can inadvertently produce voltages of injection frequency at either or both of the output terminals 22 or 23. To neutralize or balance out such $I_c$ voltages caused by the leakage paths, resistors 26 and 27 across the output terminals may be relatively adjusted to eliminate all traces of the injection frequency caused by resistive leakage. There are, further, the likelihood of injection frequency components at the output because of unbalanced inductive effects between the several leads. Such inductive effects can be balanced reactively by appropriate adjustments of the condensers 29 and 30.

Transmitters constructed according to this invention will suppress the carrier 70 db down from the sideband voltages. The result is a highly efficient distortion-free sideband modulator.

What is claimed is:

1. In combination in a modulator, a Hall-effect generator including a body of semiconductor material with means for passing current along a first axis of said body, means for passing a magnetic field along a second axis orthogonal to said first axis, and output terminals attached to said body on a third axis orthogonal to said first and second axes, a carrier wave generator, said carrier wave generator being coupled to said first axis of said body, a signal source, said signal source being coupled to the mentioned magnetic means for signal modulating said magnetic field to in turn modulate the carrier of said generator, and an output circuit coupled to said output terminals, a reactive impedance coupled between said output terminals, and means for establishing a reference ground at the electrical center of said impedance.

2. In combination in a sideband transmitter, an injection frequency source, a signal source, a Hall-effect product generator including a magnetic circuit, a wafer of semiconducting material disposed in and perpendicular to the lines of force of said magnetic circuit, said magnetic circuit being coupled to said signal source, said injection frequency source being coupled to one pair of terminals at opposite edges of said wafer, output terminals connected across the terminals at the remaining edges of said wafer, series resistors connected potentiometer fashion across said output terminals, said resistors of said potentiometer being relatively adjustable to establish a reference ground electrical center where the injection frequency is zero, and a transmitting circuit coupled to said electrical center.

3. In combination in a sideband transmitter, a source of injection frequencies, a signal source, a Hall-effect product generator including a magnetic core having an air gap, a flattened rectangular wafer of semiconductor material disposed in said air gap, a first pair of terminals connected to two side edges of said wafer, said first pair of terminals being connected to said injection frequency source, a winding on said core, said winding being connected to said signal source, a second pair of terminals connected to the remaining side edges of said wafer where components of the product of said two sources appear, a potentiometer with at least two series-connected resistors connected between said second pair of terminals, one at least of said resistors being adjustable to balance out at the junction of said two resistor components of injection frequency voltages appearing at said first pair of terminals caused by leakage currents between said first and second pairs of terminals, and an output circuit coupled to said potentiometer.

4. The combination defined in claim 3 further comprising a condenser across each resistor of said potentiometer, at least one of said condensers being adjustable to balance the reactive component of said injection frequencies appearing at the ends of said resistors.

References Cited in the file of this patent

UNITED STATES PATENTS

| | | |
|---|---|---|
| 2,649,574 | Mason | Aug. 18, 1953 |
| 2,695,930 | Wallace | Nov. 30, 1954 |
| 2,714,182 | Hewitt | July 26, 1955 |
| 2,907,831 | De Jager et al. | Oct. 6, 1959 |